(12) United States Patent
Bryans et al.

(10) Patent No.: US 10,835,033 B2
(45) Date of Patent: Nov. 17, 2020

(54) ELECTRONICS ENCLOSURE MOUNTING

(71) Applicant: Bose Corporation, Framingham, MA (US)

(72) Inventors: Darryl John Bryans, Natick, MA (US); Benjamin Lippitt, Worcester, MA (US); Marc Brandon Happes, Quincy, MA (US); Daniel T. Lynch, Winter Haven, FL (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 16/566,483

(22) Filed: Sep. 10, 2019

(65) Prior Publication Data

US 2020/0000218 A1   Jan. 2, 2020

Related U.S. Application Data

(63) Continuation of application No. 15/416,951, filed on Jan. 26, 2017, now Pat. No. 10,492,602.

(51) Int. Cl.
| | |
|---|---|
| *A47B 21/04* | (2006.01) |
| *A47B 21/06* | (2006.01) |
| *H05K 7/14* | (2006.01) |
| *F16B 1/00* | (2006.01) |
| *F16M 13/02* | (2006.01) |

(Continued)

(52) U.S. Cl.
CPC ............. *A47B 21/04* (2013.01); *A47B 21/06* (2013.01); *F16B 1/00* (2013.01); *F16M 11/04* (2013.01); *F16M 11/041* (2013.01); *F16M 11/22* (2013.01); *F16M 13/02* (2013.01); *H05K 5/0204* (2013.01); *H05K 7/14* (2013.01);

(Continued)

(58) Field of Classification Search
CPC .................. H05K 5/0204; A47B 21/06; A47B 2021/066; H01R 9/16; H01R 25/006; H01H 9/025
See application file for complete search history.

(56) References Cited

U.S. PATENT DOCUMENTS 3,706,882 A * 12/1972 Eby .......................... B60Q 1/18
                                                        362/398
4,058,357 A * 11/1977 Wallace .............. B60R 11/0205
                                                         439/40

(Continued)

FOREIGN PATENT DOCUMENTS

| FR | 2794928 A1 * | 12/2000 | ............. H01H 9/025 |
| JP | 3152564 B2 * | 4/2001 | ............. H01H 9/025 |
| WO | WO-2015127499 A1 * | 9/2015 | ............... H02G 3/14 |

*Primary Examiner* — Eret C McNichols
(74) *Attorney, Agent, or Firm* — Brian M. Dingman; Dingman IP Law, PC

(57) ABSTRACT

A system for magnetically securing an electronics enclosure proximate a surface of a separate structure. The system includes a mounting apparatus that has a first surface, a second surface, and an interface structure that is constructed and arranged to allow the mounting apparatus to be secured to the surface of the separate structure, with the first surface of the mounting apparatus closer to the surface of the separate structure than is the second surface of the mounting apparatus. One or more magnets are fixed to one or both of the mounting apparatus and the electronics enclosure such that the one or more magnets are arranged to magnetically couple the electronics enclosure to the mounting apparatus.

16 Claims, 8 Drawing Sheets

(51) Int. Cl.
*H05K 5/02* (2006.01)
*F16M 11/04* (2006.01)
*F16M 11/22* (2006.01)

(52) U.S. Cl.
CPC . *A47B 2200/008* (2013.01); *A47B 2200/0079* (2013.01); *F16B 2001/0035* (2013.01)

(56) References Cited

U.S. PATENT DOCUMENTS

| | | | | |
|---|---|---|---|---|
| 5,921,516 | A * | 7/1999 | Ho | A47B 91/00 248/206.5 |
| 5,943,208 | A * | 8/1999 | Kato | G06F 1/184 248/222.11 |
| 6,329,597 | B1 * | 12/2001 | Kaloustian | A47B 21/06 174/67 |
| 6,595,144 | B1 * | 7/2003 | Doyle | A47B 9/00 108/147 |
| 6,957,962 | B2 * | 10/2005 | Tomino | H01R 9/16 248/206.5 |
| 6,994,305 | B2 * | 2/2006 | Schenk, Jr. | B25B 11/002 248/205.1 |
| 7,099,158 | B1 * | 8/2006 | Bjorklund | H04Q 1/02 248/346.03 |
| 7,287,738 | B2 * | 10/2007 | Pitlor | H02G 3/20 248/205.4 |
| 7,374,142 | B2 * | 5/2008 | Carnevali | F16M 13/00 224/183 |
| 8,353,491 | B2 * | 1/2013 | Mezue | H04B 1/3888 248/205.1 |
| 8,462,518 | B2 * | 6/2013 | Marroquin | H05K 7/10 361/807 |
| 8,517,234 | B2 * | 8/2013 | Kincaid | F41C 33/045 224/192 |
| 8,525,626 | B2 * | 9/2013 | Tait | H01F 7/0252 335/285 |
| 8,870,143 | B2 * | 10/2014 | Kubin | F16M 13/04 248/222.52 |
| 8,936,222 | B1 * | 1/2015 | Bastian | A45F 5/00 224/183 |
| 8,979,048 | B2 * | 3/2015 | Tschann | B64D 43/00 248/221.11 |
| 9,318,886 | B1 * | 4/2016 | Pate | H01R 11/30 |
| 9,369,790 | B2 * | 6/2016 | Schreiber | H04R 1/08 |
| 9,437,969 | B2 * | 9/2016 | Witter | H01R 13/6205 |
| 2005/0045784 | A1 * | 3/2005 | Pitlor | H02G 3/20 248/206.5 |
| 2005/0167547 | A1 * | 8/2005 | McLellan | B60Q 1/2615 248/74.4 |
| 2007/0159035 | A1 * | 7/2007 | Mullen | A47B 21/06 312/245 |
| 2007/0235222 | A1 * | 10/2007 | Hubbard | A47B 21/06 174/480 |
| 2009/0193724 | A1 * | 8/2009 | Struthers | H02G 3/00 52/27 |
| 2010/0301720 | A1 * | 12/2010 | Anderson | A47B 21/06 312/319.2 |
| 2012/0309229 | A1 * | 12/2012 | Yang | F16M 11/06 439/620.01 |
| 2012/0326577 | A1 * | 12/2012 | Lin | H05K 5/0247 312/223.1 |
| 2014/0096706 | A1 * | 4/2014 | Labrosse | A47B 21/06 108/21 |
| 2015/0144754 | A1 * | 5/2015 | Elharar | B60R 11/0241 248/230.8 |
| 2015/0208520 | A1 * | 7/2015 | Le | H05K 5/0004 361/724 |
| 2016/0040825 | A1 * | 2/2016 | Franklin | F16M 13/022 439/39 |
| 2016/0167853 | A1 * | 6/2016 | Gallup | A47G 29/10 248/205.2 |
| 2016/0246328 | A1 * | 8/2016 | Christie, II | G06F 1/1632 |
| 2017/0112275 | A1 * | 4/2017 | Danville | A47B 83/001 |
| 2017/0143113 | A1 * | 5/2017 | Park | A47B 21/06 |
| 2018/0000240 | A1 * | 1/2018 | Yamamoto | A47B 9/20 |
| 2018/0206631 | A1 * | 7/2018 | Bryans | F16M 11/041 |
| 2018/0242730 | A1 * | 8/2018 | Gershfeld | A47B 21/06 |

\* cited by examiner

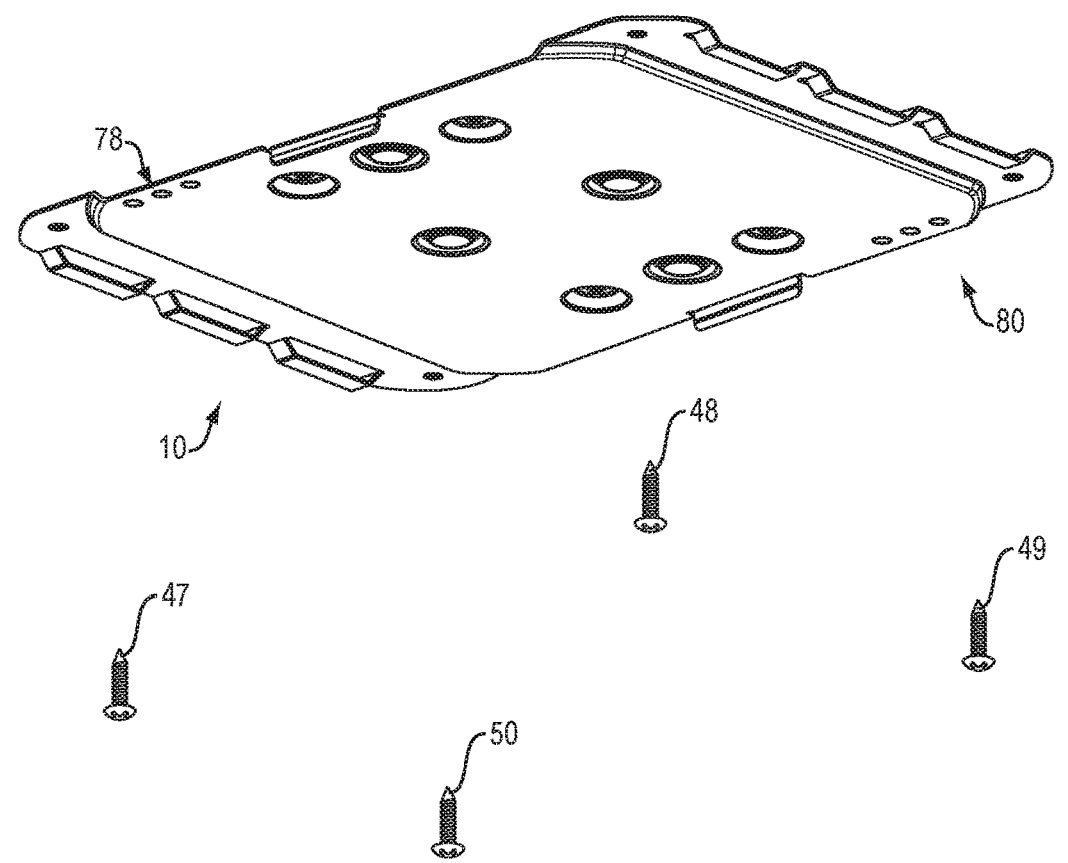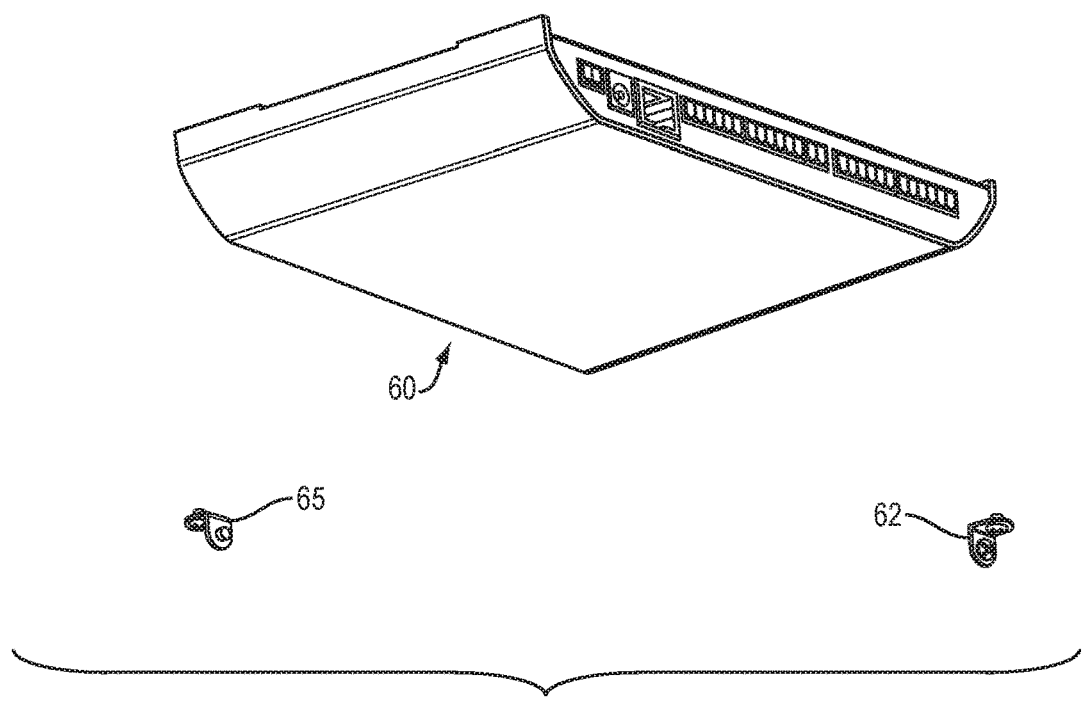
FIG. 6

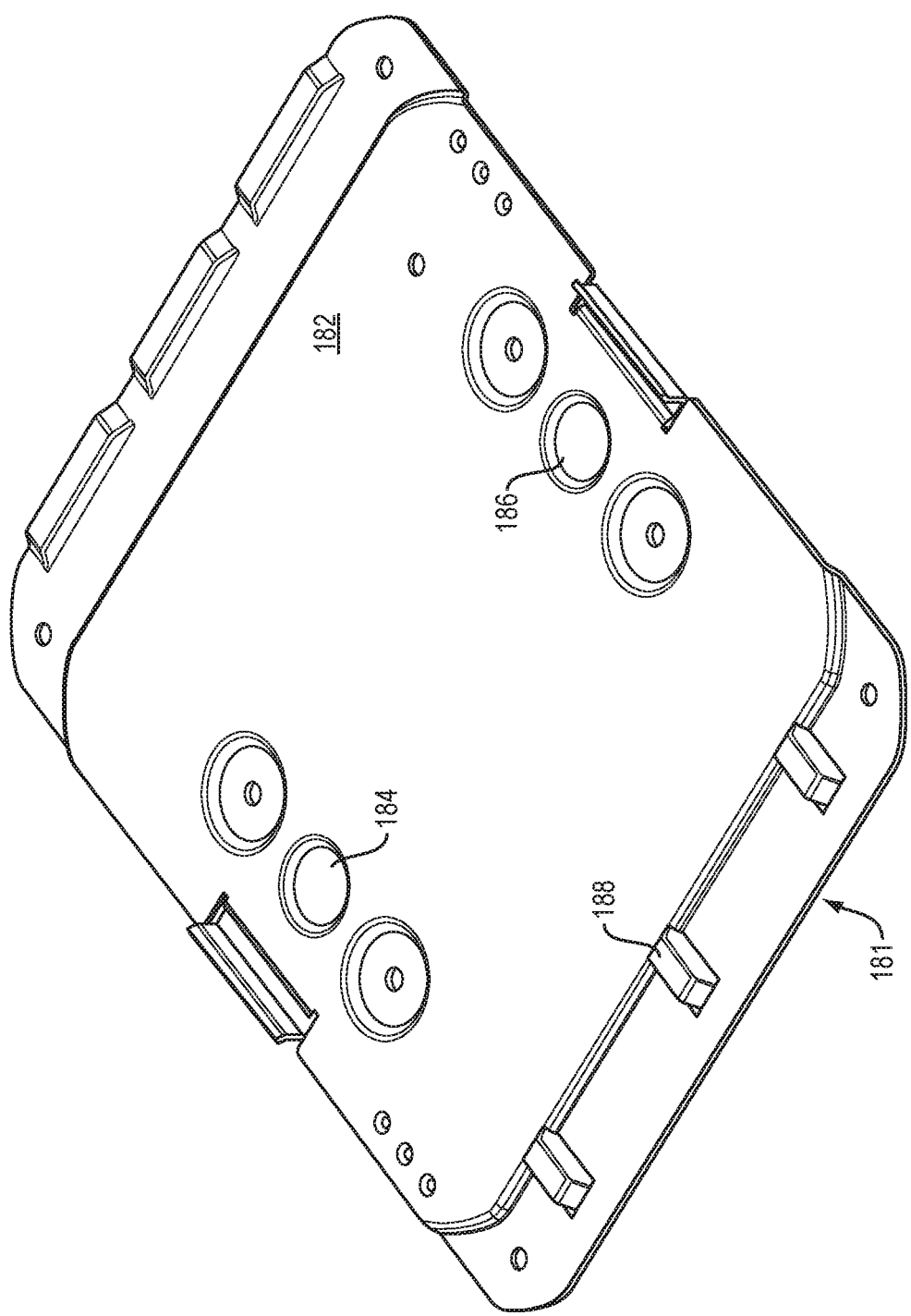

ELECTRONICS ENCLOSURE MOUNTING

CROSS-REFERENCE TO RELATED APPLICATION

This application is a continuation of and claims priority to application Ser. No. 15/416,951 filed on Jan. 26, 2017.

BACKGROUND

This disclosure relates to an apparatus that is used to mount an electronics enclosure to a separate structure.

Electronics enclosures, such as audio or video network interface devices, are sometimes permanently mounted to an underside surface such as the underside of a conference room table. Installers typically need to crawl under the table and screw the device to the underside of the table. The installer must also connect to the interface device wires from devices such as microphones on top of the table, and devices and connection points under the table. These tasks are awkward and difficult and time consuming to accomplish. Also, the installer can damage the table during installation. If the device later needs to be removed or replaced, the same issues exist.

SUMMARY

All examples and features mentioned below can be combined in any technically possible way.

In one aspect, a system for magnetically securing an electronics enclosure that has a first surface proximate a surface of a separate structure, includes a mounting apparatus that has a first surface, a second surface, and an interface structure that is constructed and arranged to allow the mounting apparatus to be secured to the surface of the separate structure, with the first surface of the mounting apparatus closer to the surface of the separate structure than is the second surface of the mounting apparatus. One or more magnets are fixed at one or both of the second surface of the mounting apparatus and the first surface of the electronics enclosure, such that one or more of the magnets are arranged to magnetically couple the electronics enclosure to the mounting apparatus.

Embodiments may include one of the following features, or any combination thereof. The mounting apparatus may further include at least one magnet retention feature in the second surface of the mounting apparatus, each magnet retention feature structured for retaining a magnet fixed to the mounting apparatus. The at least one magnet retention feature may comprise a depression in the second surface of the mounting apparatus. The depression may be constructed and arranged such that a magnet that is located in the depression has an external surface that is at or above the second surface of the mounting apparatus. The mounting apparatus may comprise a plurality of spaced magnet-retention depressions in its second surface, wherein each depression is constructed and arranged such that a magnet that is retained in the depression has an external surface that is at or above the second surface of the mounting apparatus. The interface structure that is constructed and arranged to allow the mounting apparatus to be secured to the surface of the separate structure, with the first surface of the mounting apparatus closer to the surface of the separate structure than is the second surface of the mounting apparatus, may comprise a plurality of spaced apertures extending between the first and second surfaces of the mounting apparatus, each of the apertures structured to accept a fastener.

Embodiments may include one of the above and/or below features, or any combination thereof. The mounting apparatus may also include at least one secondary securing feature, where each secondary securing feature is constructed and arranged to mechanically secure the electronics enclosure to the mounting apparatus. The secondary securing feature may comprise a mechanical securing structure that is arranged to be fixed to both the electronics enclosure and the mounting apparatus. The second surface of the mounting apparatus may comprise an electronics enclosure interface structure that is structured to engage with a portion of the electronics enclosure. The electronics enclosure interface structure may have two opposed sides. The mounting apparatus may further comprise two spaced sets of spaced apertures extending between the first and second surfaces of the mounting apparatus, each of the apertures structured to accept a fastener for fastening a mechanical securing structure to the second surface of the mounting apparatus. There may be one set of spaced apertures proximate each opposed side of the electronics enclosure interface structure. The apertures in each set may be aligned along an axis, and the axes for the two sets may be generally parallel.

Embodiments may include one of the above and/or below features, or any combination thereof. The mounting apparatus may further comprise spaced electronics enclosure alignment features that are structured to engage with the electronics enclosure so as to accomplish a predefined orientation and alignment of the electronics enclosure on the mounting apparatus. The spaced electronics enclosure alignment features may each comprise a tab projecting from the second surface of the mounting apparatus, each tab constructed and arranged to fit into a slot in the electronics enclosure.

Embodiments may include one of the above and/or below features, or any combination thereof. The mounting apparatus may further comprise at least one cable support feature that is structured to directly, or indirectly, support a cable. The cable support feature may comprise a raised structure that extends above the second surface of the mounting apparatus. The second surface of the mounting apparatus may comprise an electronics enclosure interface structure that is structured to engage with a portion of the electronics enclosure. The electronics enclosure interface structure may have two opposed sides. The cable support feature may comprise two spaced sets of raised structures that extend above the second surface of the mounting apparatus. There may be one set of raised structures proximate each opposed side of the electronics enclosure interface structure.

In another aspect, a system for securing an electronics enclosure proximate a surface of a separate structure, includes a mounting apparatus comprising a first surface, a second surface, and an interface structure that is constructed and arranged to allow the mounting apparatus to be secured to the surface of the separate structure, with the first surface of the mounting apparatus closer to the surface of the separate structure than is the second surface of the mounting apparatus, and at least one cable support feature that is structured to directly, or indirectly, support a cable, wherein the at least one cable support feature comprises a raised structure that extends above the second surface of the mounting apparatus. The second surface of the mounting apparatus may comprise an electronics enclosure interface structure that is structured to engage with a portion of the electronics enclosure. The electronics enclosure interface structure may have two opposed sides. The cable support feature may comprise two spaced sets of raised structures that extend above the second surface of the mounting apparatus. There may be one set of raised structures proximate each opposed side of the electronics enclosure interface structure.

In another aspect, a system for securing an electronics enclosure proximate a surface of a separate structure, includes a mounting apparatus comprising a first surface, a second surface, and an interface structure that is constructed and arranged to allow the mounting apparatus to be secured to the surface of the separate structure, with the first surface of the mounting apparatus closer to the surface of the separate structure than is the second surface of the mounting apparatus, and at least one secondary securing feature, where each secondary securing feature is constructed and arranged to mechanically secure the electronics enclosure to the mounting apparatus.

Embodiments may include one of the above and/or below features, or any combination thereof. The secondary securing feature may comprise a mechanical securing structure that is adapted to be fixed to both the electronics enclosure and the mounting apparatus. The second surface of the mounting apparatus may comprise an electronics enclosure interface structure that is structured to engage with a portion of the electronics enclosure. The electronics enclosure interface structure may have two opposed sides. The mounting apparatus may further comprise two spaced sets of spaced apertures extending between the first and second surfaces of the mounting apparatus, each of the apertures structured to accept a fastener for fastening a mechanical securing structure to the second surface of the mounting apparatus. There may be one set of spaced apertures proximate each opposed side of the electronics enclosure interface structure. The apertures in each set may be aligned along an axis, and the axes for the two sets may be generally parallel.

In another aspect, a system for securing an electronics enclosure proximate a surface of a separate structure, includes a mounting apparatus comprising a first surface, a second surface, and an interface structure that is constructed and arranged to allow the mounting apparatus to be secured to the surface of the separate structure, with the first surface of the mounting apparatus closer to the surface of the separate structure than is the second surface of the mounting apparatus, and spaced electronics enclosure alignment features that are structured to engage with the electronics enclosure so as to accomplish a predefined orientation and alignment of the electronics enclosure on the mounting apparatus. The spaced electronics enclosure alignment features may each comprise a tab projecting from the second surface of the mounting apparatus, each tab constructed and arranged to fit into a slot in the electronics enclosure.

In another aspect, an assembly includes a mounting apparatus comprising a first surface, a second surface, and an interface structure that is constructed and arranged to allow the mounting apparatus to be secured to the surface of the separate structure, with the first surface of the mounting apparatus closer to the surface of the separate structure than is the second surface of the mounting apparatus. There is an electronics enclosure with a first surface. One or more magnets are fixed to one or both of the second surface of the mounting apparatus and the first surface of the electronics enclosure. The first surface of the electronics enclosure is constructed and arranged to be magnetically secured to the second surface of the mounting apparatus by magnetic attraction.

Embodiments may include one of the above and/or below features, or any combination thereof. The mounting apparatus may further comprise at least one magnet retention feature in the second surface of the mounting apparatus, each magnet retention feature structured for retaining a magnet fixed to the mounting apparatus, wherein the at least one magnet retention feature comprises a depression in the second surface of the mounting apparatus. The mounting apparatus may further comprise spaced electronics enclosure alignment features that are structured to engage with the electronics enclosure so as to accomplish a predefined orientation and alignment of the electronics enclosure on the mounting apparatus. The spaced electronics enclosure alignment features may each comprise a tab projecting from the second surface of the mounting apparatus, each tab constructed and arranged to fit into a slot in the electronics enclosure.

Embodiments may include one of the above and/or below features, or any combination thereof. The assembly may include at least one secondary securing feature, which may be constructed and arranged to mechanically secure the electronics enclosure to the mounting apparatus. The secondary securing feature may comprise a mechanical securing structure that is structured to be fixed to both the electronics enclosure and the mounting apparatus. The second surface of the mounting apparatus may comprise an electronics enclosure interface structure that is structured to engage with a portion of the electronics enclosure. The electronics enclosure interface structure may have two opposed sides. The mounting apparatus may further comprise two spaced sets of spaced apertures extending between the first and second surfaces of the mounting apparatus, each of the apertures structured to accept a fastener for fastening a mechanical securing structure to the second surface of the mounting apparatus. There may be one set of spaced apertures proximate each opposed side of the electronics enclosure interface structure. The apertures in each set may be aligned along an axis, and the axes for the two sets may be generally parallel.

Embodiments may include one of the above and/or below features, or any combination thereof. The mounting apparatus may further comprise at least one cable support feature that is structured to directly, or indirectly, support a cable. The at least one cable support feature may comprise a raised structure that extends above the second surface of the mounting apparatus. The second surface of the mounting apparatus may comprise an electronics enclosure interface structure that is structured to engage with a portion of the electronics enclosure. The electronics enclosure interface structure may have two opposed sides. The cable support features may comprise two spaced sets of raised structures that extend above the second surface of the mounting apparatus. There may be one set of raised structures proximate each opposed side of the electronics enclosure interface structure.

BRIEF DESCRIPTION OF THE DRAWINGS

FIG. 6 is an exploded view of the assembly of FIG. 5.

FIG. 9 is a perspective view of another electronics enclosure mounting apparatus.

DETAILED DESCRIPTION

Electronics enclosures, such as those that house audio or video network interface devices and other electronic or electrical devices that are used for room audio, video and/or conferencing, are sometimes mounted to the underside of conference room tables. Installers typically need to crawl under the table and screw the device to the underside of the table. The installer must also connect to the interface device wires from other devices, such as microphones on top of the table, and devices and connection points under the table. During installation, many times the device will need to be secured and removed multiple times. All these tasks are awkward, difficult, and time consuming to accomplish. Also, the installer can damage the table during installation. If the device later needs to be removed or replaced, the same issues exist.

The present electronics enclosure mounting apparatus is arranged to hold an electronics enclosure such as an audio network interface device to the underside of a table, cabinet, or shelf (or, to hold it to another type separate structure such as another piece of furniture, or a wall or partition, for example, and/or a location other than the underside of the separate structure) with magnets. The magnets are coupled to one or both of a magnet carrier that is attached to the underside of the table, and the electronics enclosure. The magnetic coupling of the electronics enclosure to the table allows the enclosure to be coupled to the table simply by aligning the enclosure with the magnet carrier. The electronics enclosure can also be easily removed and replaced, all without the need for any tools.

The magnet carrier may comprise a mounting apparatus that is adapted to be secured to the underside of a table or desk, or to any part of another type of separate structure. One or more magnets can be coupled to the mounting apparatus such that the magnets are held just below the table, preferably with their surfaces exposed. A ferromagnetic portion of an electronic enclosure can then be coupled directly to the magnets. The enclosure will thus be magnetically and removably held under the table, with no tools needed to install or remove the enclosure from under the table.

Figure 1:
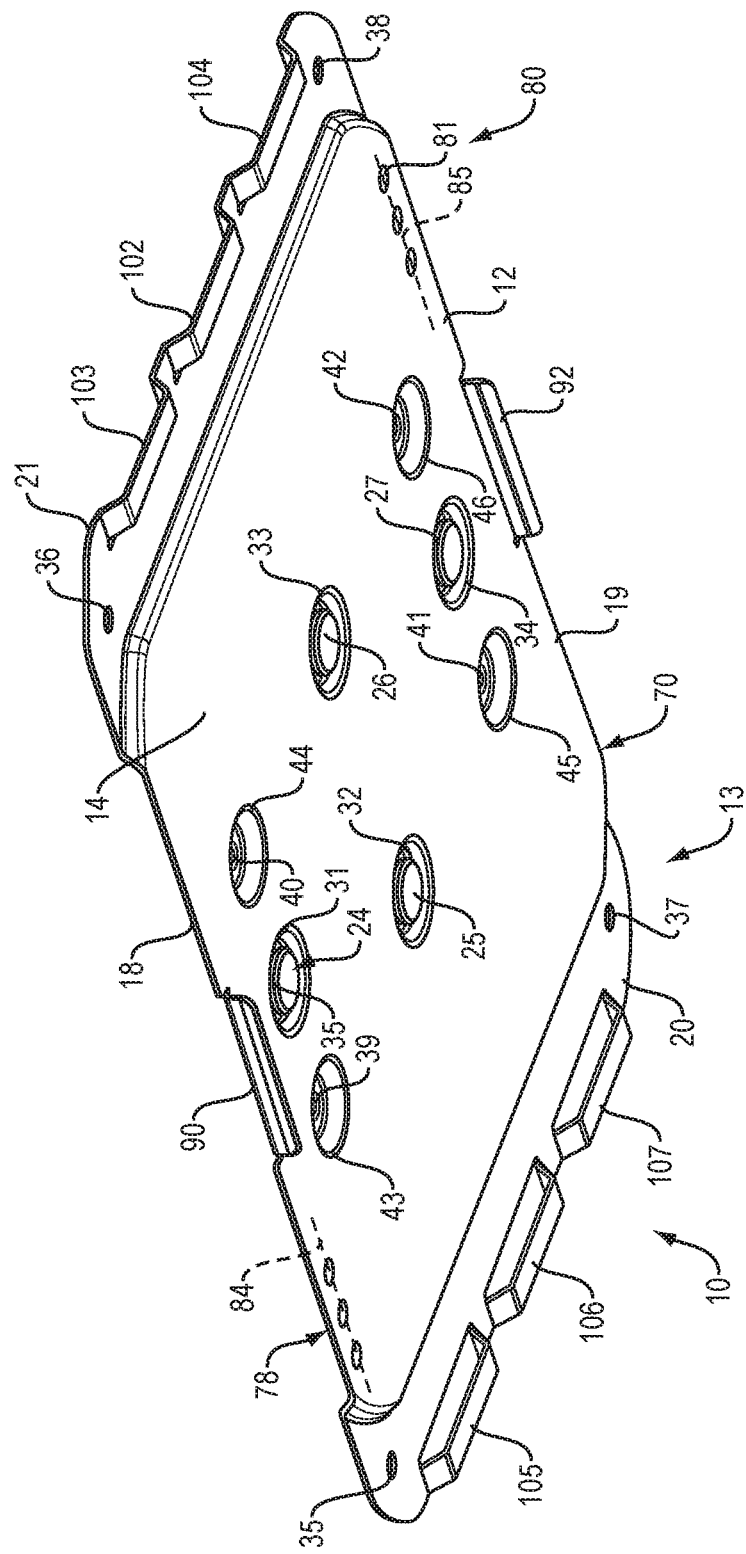
FIG. 1 is a perspective view of an electronics enclosure mounting apparatus.
Figure 2:
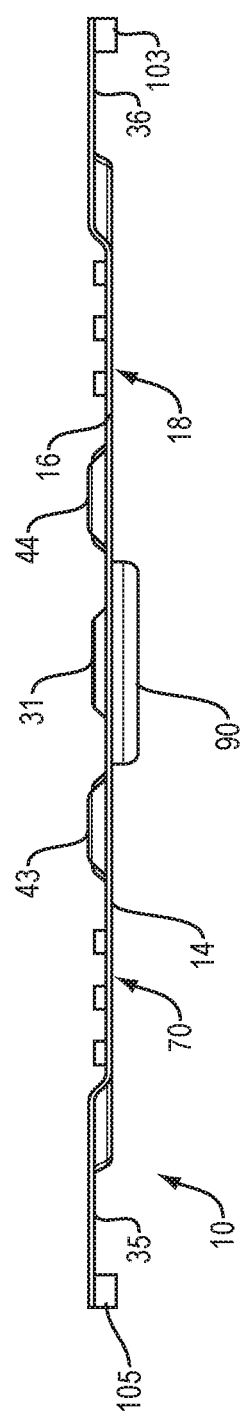
FIG. 2 is a side view of the electronics enclosure mounting apparatus of FIG. 1.
Figure 3:
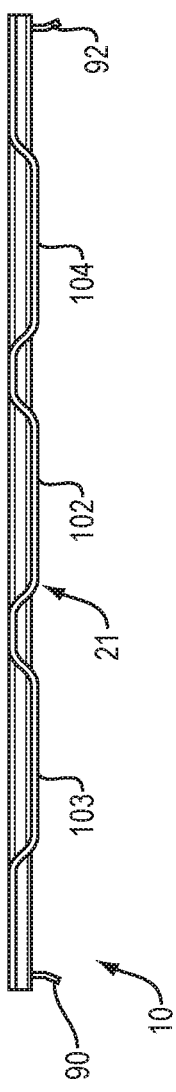
FIG. 3 is an end view of the electronics enclosure mounting apparatus of FIG. 1.
Figure 5:
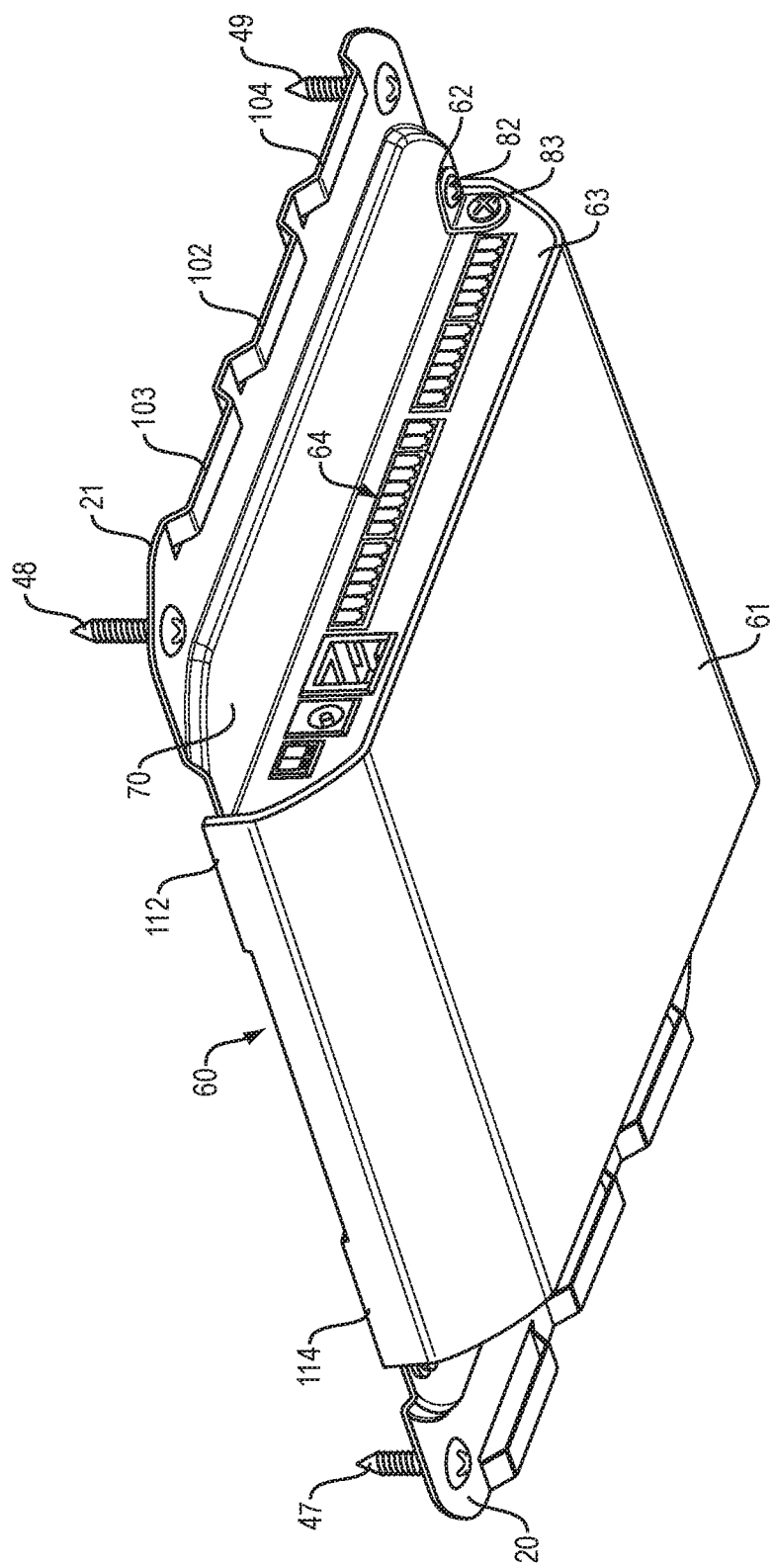
FIG. 5 is a perspective view of an assembly that includes the electronics enclosure mounting apparatus of FIG. 1.
Figure 7:
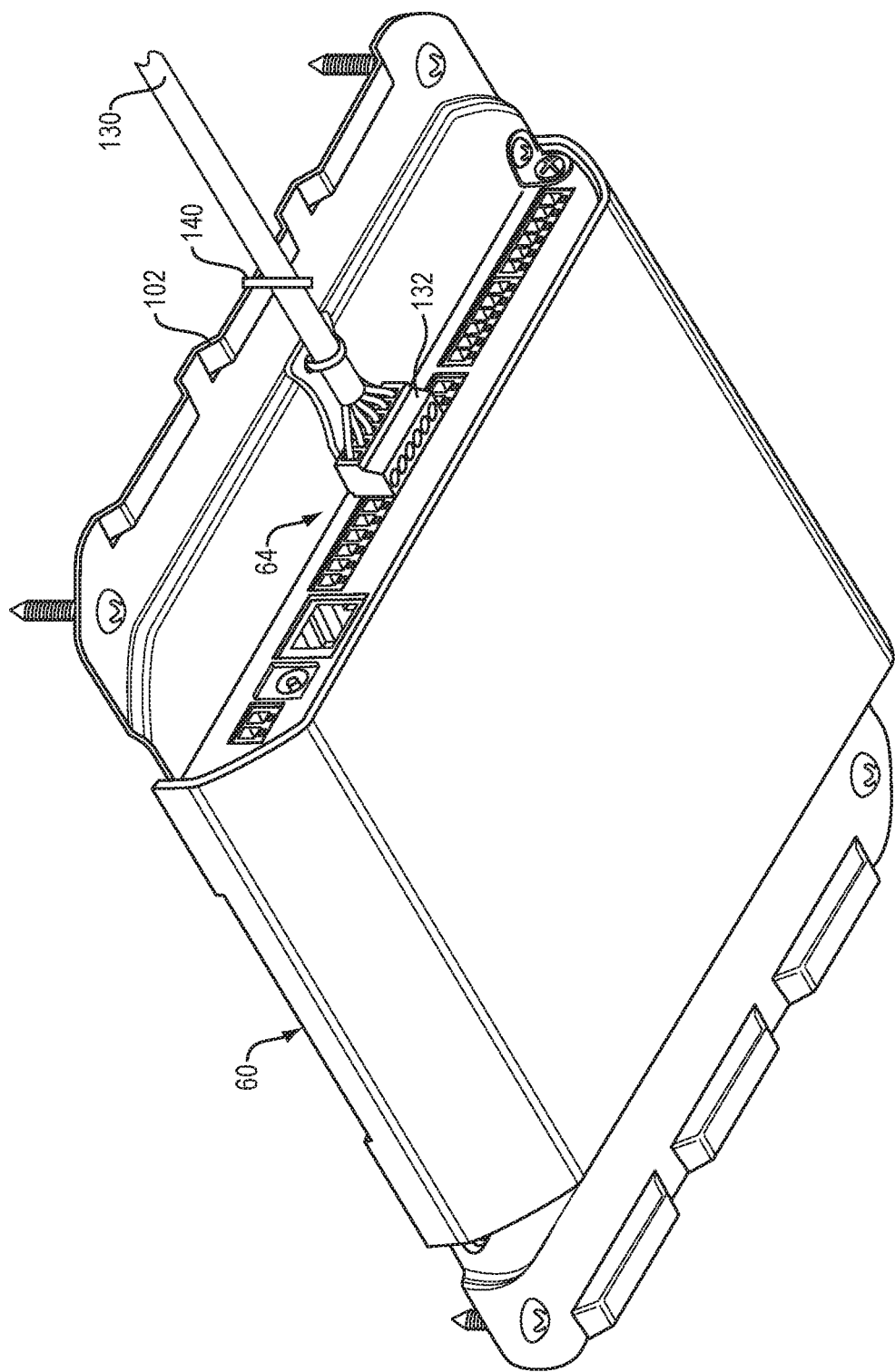
FIG. 7 is a perspective view of the assembly of FIG. 5 with a cable coupled to the electronics enclosure.
Figure 8:
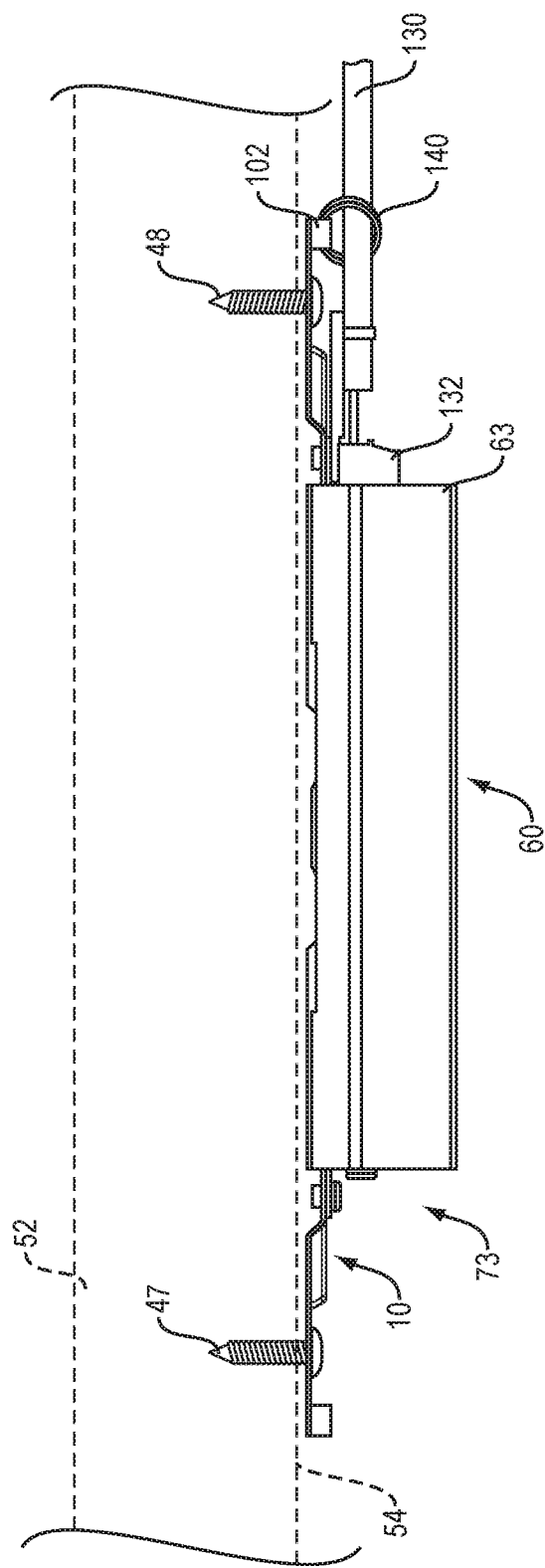
FIG. 8 is a side view of the assembly of FIG. 7, mounted to the underside of a table.

In one aspect, and as best shown in FIGS. 1-3, the present disclosure includes an electronics enclosure mounting apparatus 10 for removably securing, proximate a surface of a separate structure, an electronics enclosure that is made at least in part from a ferromagnetic material. Mounting apparatus 10 can be made from sheet metal that is formed, e.g., by stamping. Mounting apparatus 10 includes a platform 12 that has a first surface 16, and a second surface 14. An interface structure 13 is constructed and arranged to allow the platform 12 to be secured to the surface of the separate structure, with the first surface 16 of the platform 12 closer to the surface of the separate structure than is the second surface 14 of the platform 12. See FIG. 8, which shows electronics enclosure 60 mounted by apparatus 10 to the underside 54 of conference room table 52. A magnet 24 is fixed to the platform 12 such that the magnet 24 is exposed at the second surface 14 of the platform 12. As shown in FIGS. 5, 7, and 8 and further described below, an electronics enclosure 60 can be reliably secured to the separate structure by magnetically coupling the electronics enclosure (via a ferromagnetic portion of the electronics enclosure) to the magnet(s) of the mounting apparatus. Alternatively, the magnets could be mounted to the electronics enclosure and the mounting apparatus could be made from or include ferromagnetic material. Or, there could be magnets fixed to both devices. Magnetic securing of the mounting apparatus and the electronics enclosure allows the electronics enclosure to be removed from, and replaced to, its mounting location without the need for any tools.

There may also be at least one magnet retention feature in the second surface 14 of the platform 12. Each magnet retention feature is structured for retaining a magnet that is fixed to the platform 12. In the illustrated, non-limiting examples, the magnet retention feature comprises a depression 31 in the second surface 14 of the platform 12. The depression 31 may be constructed and arranged such that a magnet 24 that is located in the depression and fixed to the mounting apparatus (e.g., using an appropriate adhesive, or fixed by some other mechanical means, such as a cavity or pocket or tabs in surface 14 that retains the magnet) has an external surface 35 that is just below, or, more preferably, at, or just slightly above, the second surface 14 of the platform 12. In order to provide for securing of electronics enclosures with more weight, and/or to hold the electronics enclosure more securely, the platform may carry a plurality of magnets. In the present example depicted in FIG. 1, there are four spaced magnets 24, 25, 26, and 27, each fixed to the mounting apparatus in a depression 31, 32, 33, and 34, respectively. Each depression is preferably constructed and arranged such that a magnet that is located in the depression has an external surface that is located close to, at, or just above the second surface of the platform.

Other arrangements of one or more magnets are contemplated herein. For example, the magnets could be carried directly on surface 14. Or, the magnets could be on the electronics enclosure, or one or more magnets could be on each of the mounting apparatus and the electronics enclosure. While electronic devices with ferrous metal enclosures are common, some audio or video devices typically mounted to a surface may include non-ferrous metal enclosures such as aluminum, or non-metal enclosures such as plastic. In this event, the device to be mounted to the mounting apparatus could be designed to include an embedded, inexpensive, ferrous metal plate in the area of the mounting apparatus magnetic engagement. Alternatively, the magnets could be included in the electronic device to be mounted, rather than in the mounting apparatus if the mounting apparatus surface itself is ferrous metal. As another alternative, the magnets could be in both the mounting apparatus and the electronic device to be mounted, with care taken to ensure polarity of the magnets in the two-part system attract, rather than repel. Magnets come in a variety of materials, strengths, sizes, and shapes. The types and quantity of magnets can be selected to provide the attraction/retention force necessary for the particular application. Preferably, the magnets are small, high-strength permanent magnets, which are known in the art; such magnets include but are not limited to rare-earth magnets.

An interface structure 13 is constructed and arranged to allow the platform 12 to be secured to the surface of the separate structure. Interface structure 13 may comprise a plurality of spaced apertures 35-42, each of which extends through the thickness of platform 12, between its first 16 and second 14 surfaces. Each of these apertures are structured to accept a fastener, such as a screw. In this non-limiting example, screws 47-50 are received in apertures 35-38, located near the corners of the platform. See FIG. 6. The interior apertures 39-42 provide additional or alternative securing locations.

Mounting apparatus 10 also preferably but not necessarily includes at least one secondary securing feature, where each secondary securing feature is constructed and arranged to mechanically secure the electronics enclosure to the platform. While the primary securing feature, magnetic bond, has desirable characteristics, namely easy application and removability of the electronics enclosure, there may be applications where environmental forces, for example vibration, sheer or shock forces, that could cause the primary securing feature to fail, should be accommodated. The secondary securing feature provides an optional, mechanical securing method which can be used in this type of environment. The secondary securing features in this non-limiting example take the form of mechanical securing structures, such as small brackets, that are structured to be fixed to both the electronics enclosure and the platform. The second surface of the platform may include one or more apertures or other mechanical features that allow a bracket to be coupled to the platform. The electronics enclosure can also include one or more apertures or other mechanical features located such that one or more brackets can be secured to the electronics enclosure and the platform. The secondary securing features can take many other possible forms, where the securing features are adapted to mechanically secure the electronics enclosure to the mounting apparatus. For example, hinged tabs or spring-barb combinations provide mechanical retention and tool-less removal.

Figure 4:
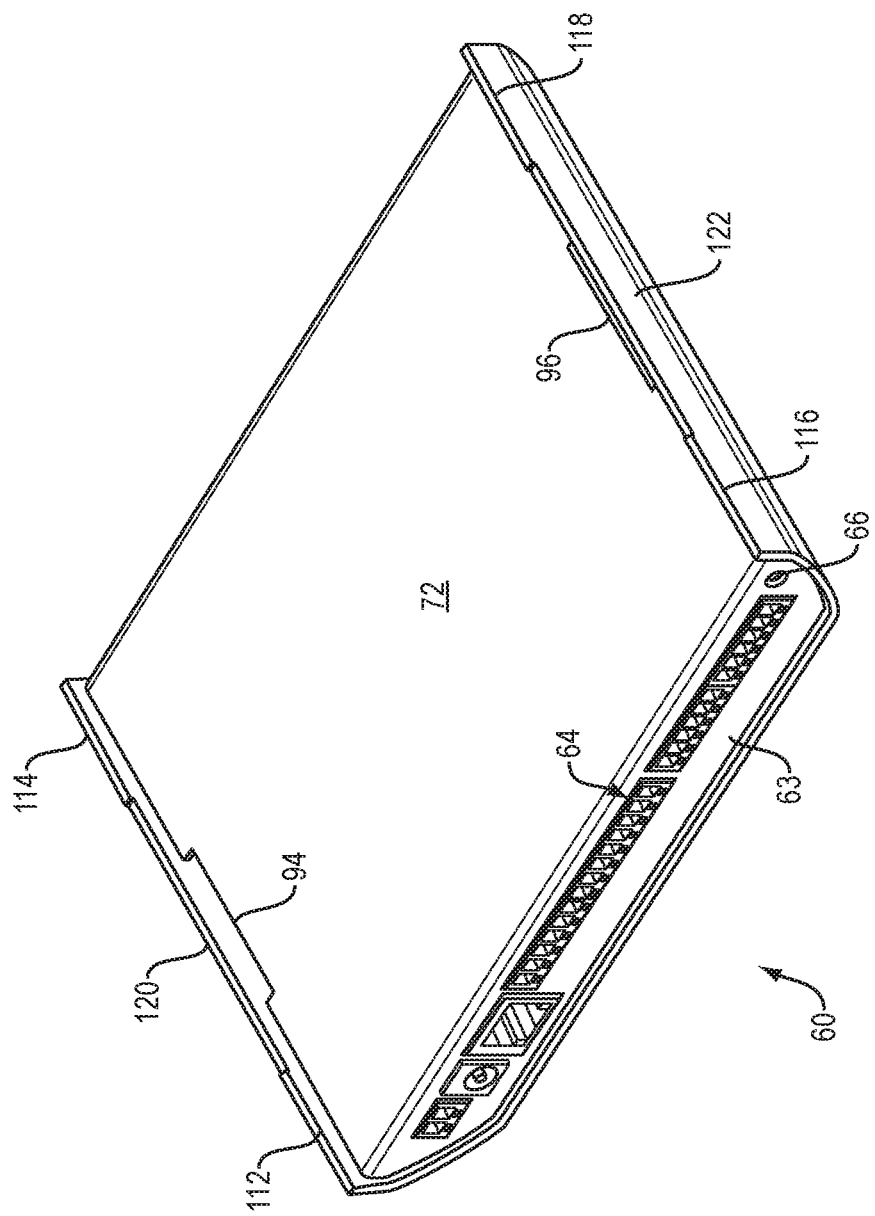
FIG. 4 is a perspective view of an electronics enclosure that can be mounted to a separate structure, with the mounting apparatus of FIG. 1.

In one non-limiting example, platform 12 includes an electronics enclosure interface structure 70 (e.g., a slightly raised pedestal, as shown in FIG. 1) that is structured to engage with a portion of the electronics enclosure that comprises ferromagnetic material. In the present non-limiting example, ferromagnetic portion 72 (see FIG. 4) of electronics enclosure 60 is structured such that it fits on and will lie flat on (or, perhaps, just off of if the magnets themselves make direct contact) interface structure 70 of platform 12. Portion 72 can be a ferromagnetic (e.g., steel) exterior wall of the enclosure. The electronics enclosure interface structure 70 has two opposed sides, 18 and 19. The platform 12 includes two spaced sets of spaced apertures extending between the first and second surfaces of the platform, each of the apertures structured to accept a fastener for fastening a bracket to the second surface of the platform. Aperture set 78 includes three closely-spaced apertures that lie along axis 84, which can lie close to side 18. Aperture set 80 includes three closely-spaced apertures (one, aperture 81, numbered), that lie along axis 85, which can lie close to side 19. Axes 84 and 85 are preferably parallel, or close to (i.e., generally) parallel.

Aperture sets 78 and 80 are arranged to allow the use of brackets 62, 65 as secondary securing features, with electronic enclosures having different widths. An assembly of electronic enclosure 60 and mounting apparatus 10, is shown in FIG. 5. Surface 72 of enclosure 60 (see FIG. 4) sits on interface structure 70. Enclosure 60 has exposed outside surface 61, and end-face 63 that carries one or more electrical contacts, collectively labelled as electrical connector set 64. Aperture 66 is located on face 63 near connector set 64. "L"-shaped bracket 62 is connected to face 63 via screw 83 that is accepted into threaded aperture 66. Bracket 62 is also connected to interface structure 70 via screw 82 that is accepted into threaded aperture 81. A second bracket 65, FIG. 6, can be used in the same fashion on the opposed face of enclosure 60 and one aperture of set 78. The other apertures of sets 78 and 80 allow this same coupling to occur with electronic enclosures that are narrower than enclosure 60. Apparatus 10 is thus designed to be used with electronics enclosures of three different widths. Alternatively, there could be only one, or two, or more than three, apertures in each set 78 and 80. There could also be only one set of apertures, or more than two sets of apertures. Also, the apertures need not be in sets. Also, mechanical coupling could be accomplished with a single bracket; two are used to help ensure that enclosure 60 cannot decouple from mounting apparatus 10 should there be any problem with the primary (magnetic) coupling.

Platform 12 also preferably but not necessarily includes spaced electronics enclosure alignment features that are structured to engage with the electronics enclosure so as to accomplish a predefined orientation and alignment of the electronics enclosure on the platform. The spaced electronics enclosure alignment features may comprise tabs 90 and 92 that project from the second surface 14 of the platform 12. Tabs 90 and 92 are each located, constructed, and arranged to fit into a slot in the electronics enclosure, as is further explained below. Additional alignment tabs could be used to ensure that the electronics enclosure is properly installed on the mounting apparatus. Such tabs could prevent magnetic engagement until the electronics enclosure was properly oriented.

Platform 12 also preferably includes at least one cable support feature that is structured to directly, or indirectly, support a cable against movement or possible disengagement caused by either vertical forces (gravity) or lateral forces (pulling of the cable). The cable support feature may comprise a raised structure that extends above the second surface of the platform. In one present non-limiting example, ends 20 and 21 of platform 12 each include three raised structures, 105-107 and 102-104, respectively, located close to the ends, outside of interface structure 70. These raised structures serve as platforms/features that can directly support a cable, or indirectly support a cable. Direct support can be accomplished by actual physical contact of a cable with a cable support feature, for example using a spring-type clip or the like. One example of such a direct support/retention feature could be a "C"-shaped clip or snap feature on the platform, whereby the 'C' is made from pliable metal and approximates the diameter of the cable. The cable is then forced into the opening, expanding the opening of the feature, followed by the pliant metal returning to original size thus retaining the cable in the center of the 'C' (not shown). Another example could be a spring-type "L"-shaped feature, whereby the cable is forced under the protruding L, and the spring nature of the metal retains the cable in place (not shown.)

Indirect cable support may be accomplished by coupling the cable to a cable support feature with another tying structure, such as a cable tie. FIGS. 7 and 8 depict cable 130 with connector 132 coupled to a connector of connector set 64 of enclosure 60. Cable tie 140 encircles cable 130 and raised cable support feature 102, so as to indirectly couple the cable to the raised cable support feature and, thus, to the platform. The size, shape, location, and quantity of raised cable support features that can act to support a cable is not limited, the examples depicted in the figures merely serving to illustrate the concept. A second example is illustrated in FIG. 9, where platform 181 has electronics enclosure interface structure 182 that carries magnets 184 and 186. Platform 181 has three raised cable support features, such as structure 188, that are turned 180 degrees in orientation relative to the cable support features shown in FIG. 1.

A typical use situation is as follows. Mounting apparatus 10 is secured to the underside 54 of table 52 via screws 47-50. Side 72 of electronics enclosure 60 is then placed against interface structure 70. Magnets 24-27 hold enclosure 60 against apparatus 10. Brackets 62 and 65 can then be installed, if desired. Appropriate coupling and securing of any cables can then be accomplished. An example of an installed assembly 73 comprising mounting apparatus 10 and coupled electronic enclosure 60, with secured cable 130, is shown in FIG. 8. Enclosure 60 can be removed simply by pulling down with sufficient force to disengage side 72 from magnets 24-27; brackets 62 and 65 would need to be removed first if they are used.

The mounting apparatus and the electronics enclosure can have structures that facilitate proper alignment of the two. This helps to simplify under-table mounting, where visualization of the necessary alignment can be difficult. The electronics enclosure can thus be mounted by feel. This alignment structure can include tabs 90 and 92 that project from surface 14 of apparatus 10, and are constructed and arranged to fit into slots 94 and 96 in enclosure 60. See FIG. 4. Tabs 90 and 92 also serve a retention purpose, in addition to guiding and positioning. The magnets will hold the electronics enclosure in place against forces that are normal to the surface of the mounting apparatus, but may not be as effective against forces in the other two directions (the two directions parallel to surface 14). Tabs 90 and 92 will resist motion of the electronics enclosure in these two directions; these motions can come about when cables are coupled to or removed from the electronics enclosure. Also, small projecting lips 112, 114, 116, and 118, on ends 120 and 122 of enclosure 60, project above surface 72. When enclosure 60 is engaged with apparatus 10, these projecting lips extend a little higher than interface structure 70. See FIG. 5. Lips 112, 114, 116, and 118 thus accomplish a positive seating of enclosure 60 on mounting apparatus 10 when the two are properly aligned, which further facilitates engagement without the need to visualize the engagement, and help in retention.

One of myriad possible alternative mounting apparatuses 181 is shown in FIG. 9. Apparatus 181 differs from apparatus 10 in that cable support feature 188 is aligned at 180 degrees to the alignment of the cable support features on apparatus 10. This can provide a longer shelf to which a cable can be coupled. Other shapes, sizes, orientations, and locations of cable support features are contemplated herein. Also, apparatus 181 carries only two magnets 184 and 186. Another possibility would be to make the platform from a flat piece of sheet metal, with magnets protruding above the surface, and potentially also with raised cable support features. In this case, the alignment tabs 90 and 92 could be made a little taller to cause the device to sit off the platform by the thickness of the magnets.

A number of implementations have been described. Nevertheless, it will be understood that additional modifications may be made without departing from the scope of the inventive concepts described herein, and, accordingly, other embodiments are within the scope of the following claims.

What is claimed is:

1. A system for magnetically securing an electronics enclosure that has a first surface, proximate a surface of a separate structure, comprising:
    a mounting apparatus comprising a first surface, a second surface, and an interface structure that is constructed and arranged to allow the mounting apparatus to be secured to the surface of the separate structure, with the first surface of the mounting apparatus closer to the surface of the separate structure than is the second surface of the mounting apparatus; and
    one or more magnets fixed at one or both of the second surface of the mounting apparatus and the first surface of the electronics enclosure, such that the one or more magnets are arranged to magnetically couple the electronics enclosure to the mounting apparatus,
    wherein the mounting apparatus further comprises spaced electronics enclosure alignment features that prevent magnetic engagement until the electronics enclosure is properly oriented,
    wherein the electronics enclosure alignment features of the mounting apparatus are structured to engage with the electronics enclosure so as to accomplish a pre-defined orientation and alignment of the electronics enclosure on the mounting apparatus,
    wherein the spaced electronics enclosure alignment features each comprise a tab projecting from the second surface of the mounting apparatus, each tab constructed and arranged to fit into a slot in the electronics enclosure.

2. The system of claim 1, wherein the mounting apparatus further comprises at least one magnet retention feature in the second surface of the mounting apparatus, each magnet retention feature structured for retaining a magnet fixed to the mounting apparatus.

3. The system of claim 1, wherein the at least one magnet retention feature comprises a depression in the second surface of the mounting apparatus.

4. The system of claim 3, wherein the depression is constructed and arranged such that a magnet that is located in the depression has an external surface that is at or above the second surface of the mounting apparatus.

5. The system of claim 4, wherein the mounting apparatus comprises a plurality of spaced magnet-retention depressions in its second surface, wherein each depression is constructed and arranged such that a magnet that is retained in the depression has an external surface that is at or above the second surface of the mounting apparatus.

6. The system of claim 1, further comprising at least one secondary securing feature, where each secondary securing feature is constructed and arranged to mechanically secure the electronics enclosure to the mounting apparatus.

7. The system of claim 6, wherein the secondary securing feature comprises a mechanical securing structure that is arranged to be fixed to both the electronics enclosure and the mounting apparatus.

8. The system of claim 7, wherein:
    the second surface of the mounting apparatus comprises an electronics enclosure interface structure that is structured to engage with a portion of the electronics enclosure;
    the electronics enclosure interface structure has two opposed sides;
    the mounting apparatus further comprises two spaced sets of spaced apertures extending between the first and second surfaces of the mounting apparatus, each of the apertures structured to accept a fastener for fastening a mechanical securing structure to the second surface of the mounting apparatus;
    there is one set of spaced apertures proximate each opposed side of the electronics enclosure interface structure; and
    the apertures in each set are aligned along an axis, and wherein the axes for the two sets are generally parallel.

9. A system for magnetically securing an electronics enclosure that has a first surface, proximate a surface of a separate structure, comprising:

a mounting apparatus comprising a first surface, a second surface, and an interface structure that is constructed and arranged to allow the mounting apparatus to be secured to the surface of the separate structure, with the first surface of the mounting apparatus closer to the surface of the separate structure than is the second surface of the mounting apparatus; and one or more magnets fixed at one or both of the second surface of the mounting apparatus and the first surface of the electronics enclosure, such that the one or more magnets are arranged to magnetically couple the electronics enclosure to the mounting apparatus, wherein the mounting apparatus further comprises spaced electronics enclosure alignment features that prevent magnetic engagement until the electronics enclosure is properly oriented, wherein the electronics enclosure alignment features of the mounting apparatus are structured to engage with the electronics enclosure so as to accomplish a pre-defined orientation and alignment of the electronics enclosure on the mounting apparatus, wherein the interface structure that is constructed and arranged to allow the mounting apparatus to be secured to the surface of the separate structure, with the first surface of the mounting apparatus closer to the surface of the separate structure than is the second surface of the mounting apparatus, comprises a plurality of spaced apertures extending between the first and second surfaces of the mounting apparatus, each of the apertures structured to accept a fastener.

10. A system for mimetically securing an electronics enclosure that has a first surface, proximate a surface of a separate structure, comprising:

a mounting apparatus comprising a first surface, a second surface, and an interface structure that is constructed and arranged to allow the mounting apparatus to be secured to the surface of the separate structure, with the first surface of the mounting apparatus closer to the surface of the separate structure than is the second surface of the mounting apparatus; and one or more magnets fixed at one or both of the second surface of the mounting apparatus and the first surface of the electronics enclosure, such that the one or more magnets are arranged to magnetically couple the electronics enclosure to the mounting apparatus, wherein the mounting apparatus further comprises spaced electronics enclosure alignment features that prevent magnetic engagement until the electronics enclosure is properly oriented, wherein the electronics enclosure alignment features of the mounting apparatus are structured to engage with the electronics enclosure so as to accomplish a pre-defined orientation and alignment of the electronics enclosure on the mounting apparatus, wherein the mounting apparatus further comprises at least one cable support feature that is structured to directly, or indirectly, support a cable wherein the at least one cable support feature comprises a raised structure that extends above the second surface of the mounting apparatus.

11. The system of claim 10, wherein:

the second surface of the mounting apparatus comprises an electronics enclosure interface structure that is structured to engage with a portion of the electronics enclosure;

the electronics enclosure interface structure has two opposed sides;

the at least one cable support feature comprises two spaced sets of raised structures that extend above the second surface of the mounting apparatus; and there is one set of raised structures proximate each opposed side of the electronics enclosure interface structure.

12. An assembly, comprising:

a mounting apparatus comprising a first surface, a second surface, and an interface structure that is constructed and arranged to allow the mounting apparatus to be secured to the surface of the separate structure, with the first surface of the mounting apparatus closer to the surface of the separate structure than is the second surface of the mounting apparatus;

an electronics enclosure with a first surface; and one or more magnets fixed to one or both of the second surface of the mounting apparatus and the first surface of the electronics enclosure;

wherein the first surface of the electronics enclosure is constructed and arranged to be magnetically secured to the second surface of the mounting apparatus by magnetic attraction, wherein the mounting apparatus further comprises spaced electronics enclosure alignment features that prevent magnetic engagement until the electronics enclosure is properly oriented, wherein the electronics enclosure alignment features of the mounting apparatus are structured to engage with the electronics enclosure so as to accomplish a pre-defined orientation and alignment of the electronics enclosure on the mounting apparatus, wherein the spaced electronics enclosure alignment features each comprise a tab protecting from the second surface of the mounting apparatus, each tab constructed and arranged to fit into a slot in the electronics enclosure.

13. The assembly of claim 12, wherein the mounting apparatus further comprises at least one magnet retention feature in the second surface of the mounting apparatus, each magnet retention feature structured for retaining a magnet fixed to the mounting apparatus, wherein the at least one magnet retention feature comprises a depression in the second surface of the mounting apparatus.

14. The assembly of claim 12, further comprising at least one secondary securing feature, wherein:

each secondary securing feature is constructed and arranged to secure the electronics enclosure to the mounting apparatus;

the secondary securing feature comprises a mechanical securing structure that is adapted to be fixed to both the electronics enclosure and the mounting apparatus;

the second surface of the mounting apparatus comprises an electronics enclosure interface structure that is structured to engage with a portion of the electronics enclosure;

the electronics enclosure interface structure has two opposed sides;

the mounting apparatus further comprises two spaced sets of spaced apertures extending between the first and second surfaces of the mounting apparatus, each of the apertures structured to accept a fastener for fastening a mechanical securing structure to the second surface of the mounting apparatus;

there is one set of spaced apertures proximate each opposed side of the electronics enclosure interface structure; and the apertures in each set axe aligned along an axis, and wherein the axes for the two sets are generally parallel.

15. An assembly, comprising:

a mounting apparatus comprising a first surface, a second surface, and an interface structure that is constructed and arranged to allow the mounting apparatus to be secured to the surface of the separate structure, with the first surface of the mounting apparatus closer to the surface of the separate structure than is the second surface of the mounting apparatus;

an electronics enclosure with a first surface; and one or more magnets fixed to one or both of the second surface of the mounting apparatus and the first surface of the electronics enclosure;

wherein the first surface of the electronics enclosure is constructed and arranged to be magnetically secured to the second surface of the mounting apparatus by magnetic attraction, wherein the mounting apparatus further comprises spaced electronics enclosure alignment features that prevent magnetic engagement until the electronics enclosure is properly oriented, wherein the electronics enclosure alignment features of the mounting apparatus are structured to engage with the electronics enclosure so as to accomplish a predefined orientation and alignment of the electronics enclosure on the mounting apparatus, wherein the mounting apparatus further comprises at least one cable support feature that is structured to directly, or indirectly, support a cable;

the at least one cable support feature comprises a raised structure that extends above the second surface of the mounting apparatus.

16. The assembly of claim 15, wherein the second surface of the mounting apparatus comprises an electronics enclosure interface structure that is structured to engage with a portion of the electronics enclosure;

the electronics enclosure interface structure has two opposed sides;

the at least one cable support feature comprises two spaced sets of raised structures that extend above the second surface of the mounting apparatus; and there is one set of raised structures proximate each opposed side of the electronics enclosure interface structure.

* * * * *